United States Patent
Suzuki et al.

(10) Patent No.: US 8,213,246 B2
(45) Date of Patent: Jul. 3, 2012

(54) SEMICONDUCTOR DEVICE

(75) Inventors: Jun Suzuki, Chuo-ku (JP); Yasuhiro Matsumoto, Chuo-ku (JP); Atsuko Momma, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 292 days.

(21) Appl. No.: 12/607,830

(22) Filed: Oct. 28, 2009

(65) Prior Publication Data

US 2010/0110812 A1   May 6, 2010

(30) Foreign Application Priority Data

Oct. 30, 2008   (JP) ................... 2008-279746

(51) Int. Cl.
*G11C 7/00*   (2006.01)
*G11C 29/00*   (2006.01)
*G11C 8/00*   (2006.01)
*G11C 8/18*   (2006.01)

(52) U.S. Cl. ........ 365/201; 365/191; 365/194; 365/220; 365/230.01; 365/233.1; 365/233.5

(58) Field of Classification Search .............. 365/191, 365/194, 201, 220, 230.01, 233.1, 233.5
See application file for complete search history.

(56) References Cited

U.S. PATENT DOCUMENTS

| | | | |
|---|---|---|---|
| 5,815,464 A * | 9/1998 | Golla et al. | 365/233.5 |
| 2004/0001366 A1* | 1/2004 | Perroni et al. | 365/199 |

FOREIGN PATENT DOCUMENTS

JP   2008-181594 A   8/2008

* cited by examiner

*Primary Examiner* — Ly D Pham
(74) *Attorney, Agent, or Firm* — Sughrue Mion, PLLC

(57) ABSTRACT

A semiconductor device includes a test circuit that generates a pulse signal from a timing signal. The test circuit outputs the pulse signal and a first set of address signals in response to a first type transition of the timing signal. The test circuit outputs the pulse signal and a second set of address signals in response to a second type transition of the timing signal. The second set of address signals is different from the first set of address signals.

18 Claims, 6 Drawing Sheets

SEMICONDUCTOR DEVICE

BACKGROUND OF THE INVENTION

1. Field of the Invention

The present invention generally relates to a semiconductor device. More specifically, the present invention relates to a semiconductor memory device allows a reduction of test time for testing the semiconductor device.

Priority is claimed on Japanese Patent Application No. 2008-279746, filed Oct. 30, 2008, the content of which is incorporated herein by reference.

2. Description of the Related Art

In recent years, there has been used a parallel test that tests, at the same time, a plurality of semiconductor memory devices such as double data rate-random access memories, hereinafter referred to as a DDR-RAMS. The parallel test may be carried out as disclosed in Japanese Unexamined Patent Application, First Publication, No. JP-A-2008-181594. A tester gives the semiconductor memory device an input of a clock signal, which is lower in rate than a normal clock signal, in order to test data input/output functions of the semiconductor memory device and memory elements. The normal clock signal is a clock signal that is used in the general operation mode. In this parallel test, when a read or write command and a column address are input to the semiconductor memory device, the semiconductor memory device is operated to drive a test mode read signal in synchronization with the rising edge or the falling edge of the input clock signal. The test mode read signal can act as a column selection signal and can be used to select data output from a memory cell array.

SUMMARY

In accordance with an embodiment, a semiconductor device may include, but is not limited to, a test circuit that generates a pulse signal from a timing signal. The test circuit outputs the pulse signal and a first set of address signals in response to a first type transition of the timing signal. The test circuit outputs the pulse signal and a second set of address signals in response to a second type transition of the timing signal. The second set of address signals is different from the first set of address signals.

In accordance with another embodiment, a semiconductor device may include, but is not limited to, a test circuit that receives a timing signal and a first set of address signals. The timing signal is generated in accordance with a single command. The test circuit generates a pulse signal from the timing signal. The test circuit outputs the pulse signal and the first set of address signals in response to a first type transition of the timing signal. The test circuit that outputs the pulse signal and a second set of address signals in response to a second type transition of the timing signal. The second set of address signals is different from the first set of address signals.

In accordance with still another embodiment, a semiconductor device may include, but is not limited to, a test circuit that receives a timing signal and a plurality of address signals. The timing signal is generated by decoding an access command to a memory area. The plurality of address signals selects data corresponding to the memory area. The test circuit that generates a one-shot pulse signal from the timing signal and a delay signal in response to a transition of the timing signal. The one-shot pulse signal indicates timings of column selection. The delay signal is delayed from the timing signal. The test circuit outputs the one-shot pulse signal and the plurality of address signals as a column address signal at a first type transition of the timing signal. The test circuit outputs the one-shot pulse signal and a set of address signals as the column address signal at a second type transition of the timing signal. The set of address signals is obtained by inverting at least one address signal of the plurality of address signals.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 6:
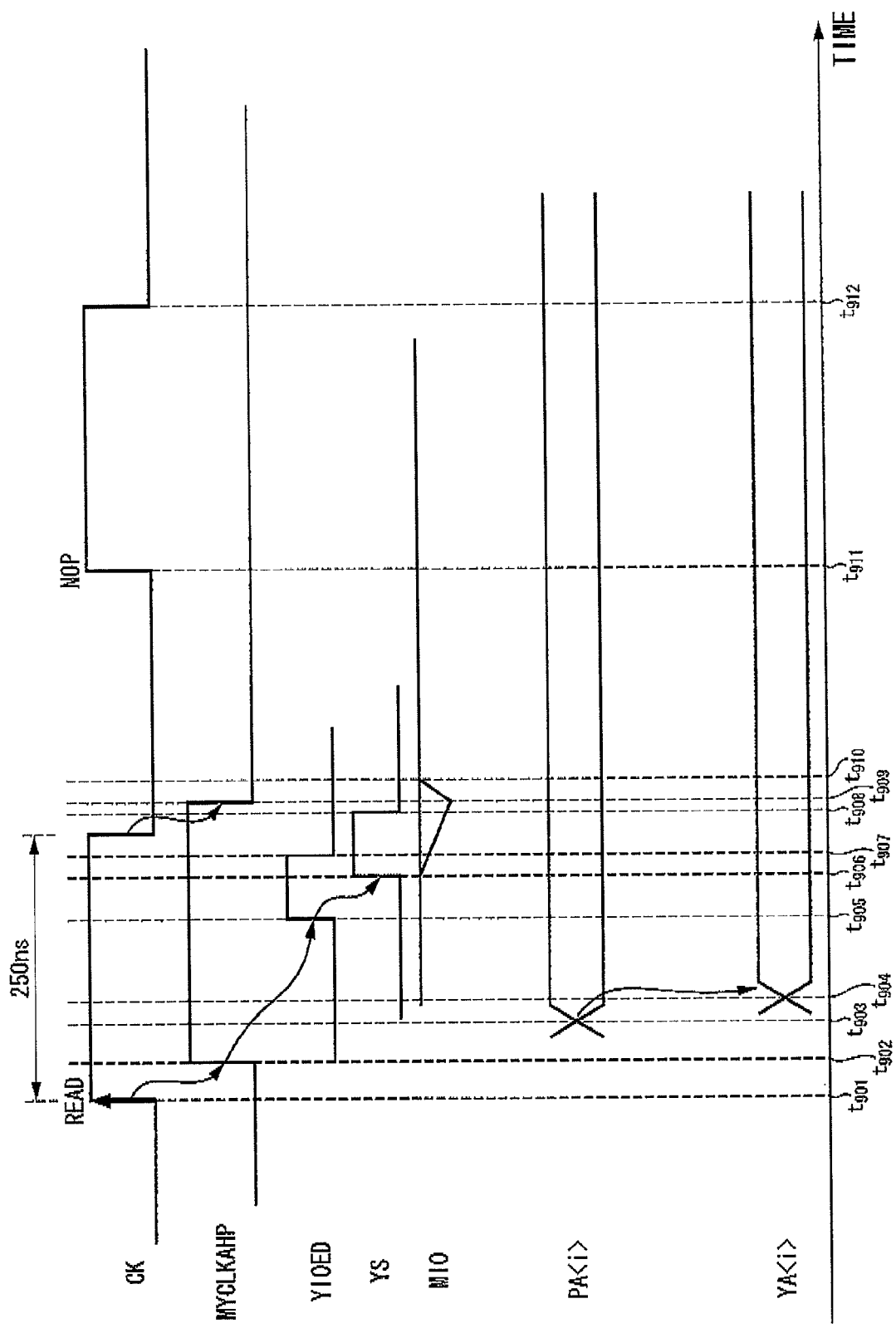
FIG. 6 is a timing chart illustrating an example of operations of the semiconductor memory device in the parallel test in the related art.

Before describing the present invention, the related art will be explained in detail with reference to FIG. 6, in order to facilitate the understanding of the present invention. FIG. 6 is a timing chart illustrating an example of operations of the semiconductor memory device in the parallel test in the related art.

At a time t901, a read command (READ) is input in synchronization with the rising edge of a clock signal CK.

At a time t902, an internal timing signal MYCLKAHP is transitioned to a high level in synchronization with the input clock signal CK.

At a time t903, an address signal with the read command that have been input from the outside at the time t901 is latched as an internal address signal PA<i>.

At a time t904, the latched internal address signal PA<i> as a column address signal YA<i> is supplied to a Y-control circuit.

At a time t905, an H-level (high-level) signal YIOED indicating the output timing of a column selection signal is supplied to a Y-selection circuit.

At a time t906, upon input of the signal YIOED, the Y-selection circuit decodes the input column address signal YA<i> and activates a column selection signal YS which corresponds to the column selected by the column address signal YA<i>. Then, data selected by the column selection signal YS is output as valid data from the memory cell array and then the output data is supplied to a main IO bus (MIO).

At a time t907, an L-level (low-level) signal YIOED is input to the Y-selection circuit. At a time t908, upon input of the L-level signal YIOED, the Y-selection circuit transitions the column selection signal YS to the L level.

At a time t909, the internal timing signal MYCLKAHP is transitioned to the low level when the clock signal CK is transitioned to the low level.

At a time t910, the output of valid data from the main IO bus (MIO) is discontinued.

At a time t911, following to the read command, a NOP command (no operation) is input at the rising edge of the clock signal CK.

In accordance with the parallel test for the semiconductor memory device shown in FIG. 6, even if the clock signal CK of a long period is supplied from the tester and the operation speed of the semiconductor memory device is relatively low, then the operations of the semiconductor memory device are synchronized with only the rising edges of the clock signal when an operation command is supplied from the outside.

For the semiconductor memory device showing operations synchronized with only the rising edges of the clock signal, if the clock signal having a long period is used, then it will take a long time to input or output data to or from the semiconductor memory device, which makes it difficult to shorten the test time. In particular, the tester performing the parallel test to test a plurality of semiconductor memory devices simultaneously has a low operation frequency, for example, of about 10 MHz. The low operation frequency makes it difficult to shorten the test time. Therefore, it had been desired to reduce as many as possible the test time. A certain reduction of the test time will reduce manufacturing costs of the semiconductor memory device.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

Hereinafter, a semiconductor memory device and a test circuit according to an embodiment of the invention will be described with reference to the accompanying drawings.

In accordance with an embodiment, a semiconductor device may include, but is not limited to, a test circuit that generates a pulse signal from a timing signal. The test circuit outputs the pulse signal and a first set of address signals in response to a first type transition of the timing signal. The test circuit outputs the pulse signal and a second set of address signals in response to a second type transition of the timing signal. The second set of address signals is different from the first set of address signals.

The test circuit may allow the semiconductor device to perform a parallel test by reading or writing data at different addresses that are designated by different address signals that have been output from the test circuit at first type and second type transitions of the timing signal. The test circuit can use both first type and second type transitions of the timing signal to give the first and second sets of address signals, so that the semiconductor memory performs a parallel test in a shortened period of time. The test circuit may receive the timing signal and a first set of address signals from outside the test circuit.

The timing signal is generated in accordance with a single command. The test circuit may use both first type and second type transitions of the timing signal that has been generated in accordance with the single command. This configuration shortens the necessary period of time for performing the semiconductor device.

The test circuit may allow the semiconductor device to perform read operations, in a parallel test mode, to read out data at the first set of address signals in response to the first type transition of the timing signal, and other data at the second set of address signals in response to the second type transition of the timing signal, the timing signal has been generated in accordance with the single command. The single command is a single read command. This configuration shortens the necessary period of time for performing the semiconductor device.

The test circuit may allow the semiconductor device to perform write operations, in a parallel test mode, to write data at the first set of address signals in response to the first type transition of the timing signal, and other data at the second set of address signals in response to the second type transition of the timing signal, the timing signal has been generated in accordance with the single command. The single command is a single write command. This configuration shortens the necessary period of time for performing the semiconductor device.

The test circuit can invert at least one address signal of the first set of address signals to generate the second set of address signals.

The test circuit can generate the pulse signal in response to the first type and second type transitions of the timing signal. This configuration shortens the necessary period of time for performing the semiconductor device.

The semiconductor device may further include, but is not limited to, a memory cell array, and a command decoding circuit. The command decoding circuit is coupled to the test circuit. The command decoding circuit decodes an access command to a memory area of the memory cell array to generate the timing signal. The command decoding circuit supplies the timing signal to the test circuit. The test circuit receives the command decoding circuit. The first set of address signals selects data corresponding to the memory area. The pulse signal indicates timings of selection to the memory cell for reading or writing data to the memory cell in the parallel test mode. The test circuit generates the pulse signal from the timing signal and a delay signal which is delayed from the timing signal.

The test circuit may include, but is not limited to, a selecting circuit that receives the timing signal, the pulse signal, and a test mode signal that indicates that a parallel test is performed. The selecting circuit selects one of the timing signal and the pulse signal based on the test mode signal.

The semiconductor device may further include, but is not limited to, a memory cell array, and a sense amplifier circuit connected to the selected column of the memory cell array. The address signal selects a column of the memory cell array for input and output of data from the selected column. The pulse signal activates the sense amplifier circuit.

The test circuit can be inactivated based a level of a test mode signal to allow the semiconductor device to perform at least one of read and write operations in a burst mode.

In accordance with another embodiment, a semiconductor device may include, but is not limited to, a test circuit that receives a timing signal and a first set of address signals. The timing signal is generated in accordance with a single command. The test circuit generates a pulse signal from the timing signal. The test circuit outputs the pulse signal and the first set of address signals in response to a first type transition of the timing signal. The test circuit that outputs the pulse signal and a second set of address signals in response to a second type transition of the timing signal. The second set of address signals is different from the first set of address signals.

The test circuit may use both first type and second type transitions of the timing signal that has been generated in accordance with the single command. This configuration shortens the necessary period of time for performing the semiconductor device.

The test circuit may allow the semiconductor device to perform a parallel test by reading or writing data at different addresses that are designated by different address signals that have been output from the test circuit at first type and second type transitions of the timing signal. The test circuit can use both first type and second type transitions of the timing signal to give the first and second sets of address signals, so that the semiconductor memory performs a parallel test in a shortened period of time. The test circuit may receive the timing signal and a first set of address signals from outside the test circuit.

The semiconductor device may further include, but is not limited to, a memory cell array, and a command decoding circuit coupled to the test circuit. The command decoding circuit decodes an access command to a memory area of the memory cell array to generate the timing signal. The command decoding circuit supplies the timing signal to the test circuit. The command decoding circuit supplies the timing signal to the test circuit. The test circuit receives the command decoding circuit.

In accordance with still another embodiment, a semiconductor device may include, but is not limited to, a test circuit that receives a timing signal and a plurality of address signals. The timing signal is generated by decoding an access command to a memory area. The plurality of address signals selects data corresponding to the memory area. The test circuit that generates a one-shot pulse signal from the timing signal and a delay signal in response to a transition of the timing signal. The one-shot pulse signal indicates timings of column selection. The delay signal is delayed from the timing signal. The test circuit outputs the one-shot pulse signal and the plurality of address signals as a column address signal at a first type transition of the timing signal. The test circuit outputs the one-shot pulse signal and a set of address signals as the column address signal at a second type transition of the timing signal. The set of address signals is obtained by inverting at least one address signal of the plurality of address signals.

The test circuit may use both first type and second type transitions of the timing signal that has been generated in accordance with the single command. This configuration shortens the necessary period of time for performing the semiconductor device.

The test circuit may allow the semiconductor device to perform a parallel test by reading or writing data at different addresses that are designated by different address signals that have been output from the test circuit at first type and second type transitions of the timing signal. The test circuit can use both first type and second type transitions of the timing signal to give the first and second sets of address signals, so that the semiconductor memory performs a parallel test in a shortened period of time. The test circuit may receive the timing signal and a first set of address signals from outside the test circuit.

The test circuit may include, but is not limited to, a selecting circuit that receives the timing signal, the one-shot pulse signal, and a test mode signal that indicates that a parallel test is performed. The selecting circuit selects one of the timing signal and the one-shot pulse signal based on the test mode signal.

The semiconductor device may include, but is not limited to, a memory cell array, and a sense amplifier circuit connected to the selected column of the memory cell array. The column address signal selects a column of the memory cell array for input and output of data from the selected column. The one-shot pulse signal activates the sense amplifier circuit.

First Embodiment

Figure 1:
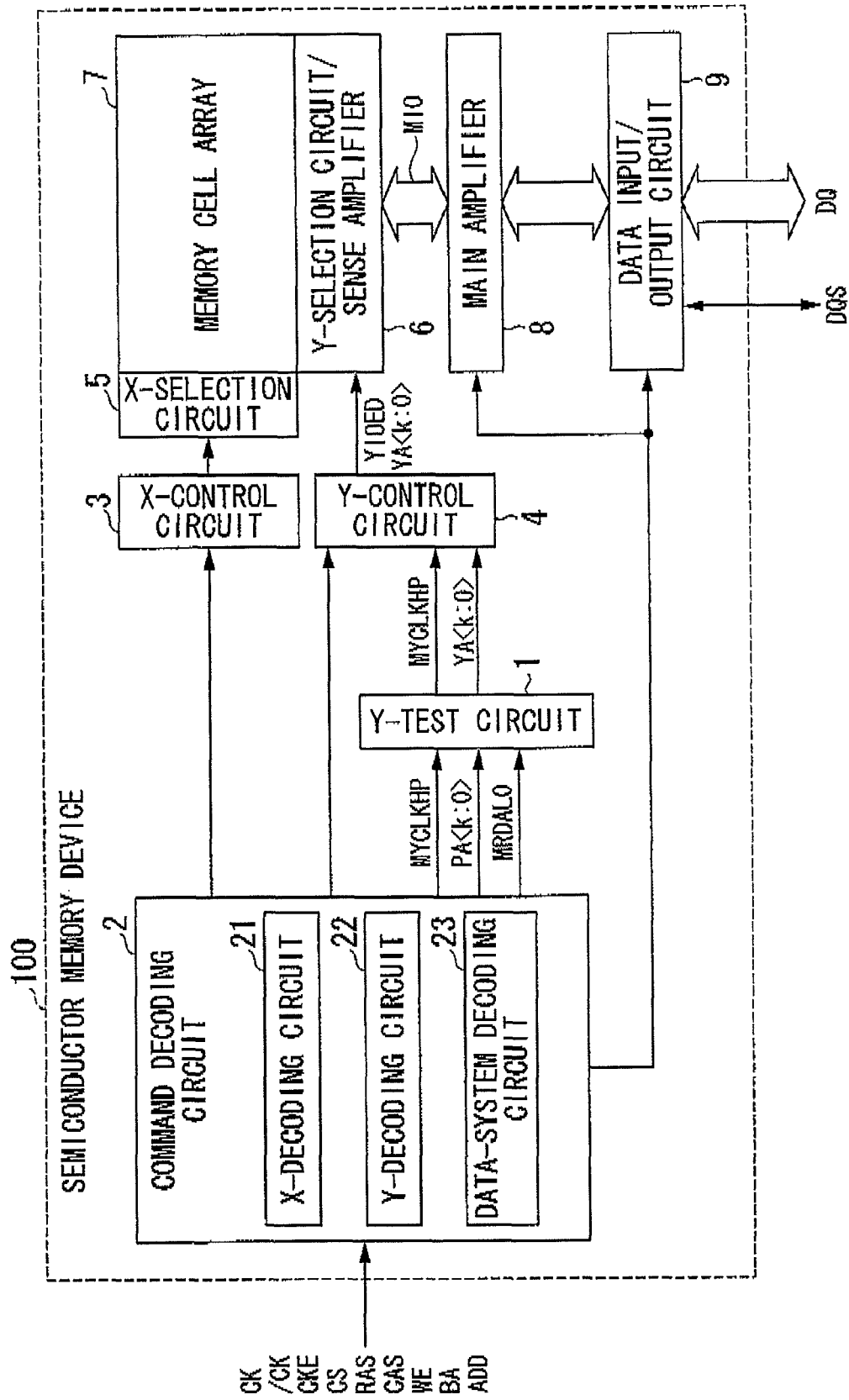
FIG. 1 is a schematic block diagram illustrating the configuration of a semiconductor memory device according to an embodiment of the present invention.

FIG. 1 is a schematic block diagram illustrating the configuration of a semiconductor memory device according to this embodiment. As shown in FIG. 1, the semiconductor memory device 100 may include, but is not limited to, a Y-test circuit 1 (a column test circuit 1), a command decoding circuit 2, an X-control circuit 3 (a row control circuit 3), a Y-control circuit 4, an X-selection circuit 5, a Y-selection circuit/sense amplifier 6, a memory cell array 7, a main amplifier 8, and a data input/output circuit 9.

The command decoding circuit 2 may include, but is not limited to, an X-decoding circuit 21, a Y-decoding circuit 22, and a data-system decoding circuit 23. The command decoding circuit 2 receives control signals from an external memory controller or a tester. The control signals that the command decoding circuit 2 receives may include a clock signal CK, an inverted clock signal /CK, a clock enable signal CKE, a chip selection signal CS, a row address strobe signal RAS, a column address strobe signal CAS, a write enable signal WE, a bank address signal BA, and an address signal. ADD.

The X-decoding circuit 21 decodes the control signals supplied from the outside. The decoded control signals serve as internal control signals. The X-decoding circuit 21 supplies the internal control signals to the X-control circuit 3 that controls row selection timing. Similar to the X-decoding circuit 21, the Y-decoding circuit 22 also decodes the control signals supplied from the outside. The decoded control signals serve as internal control signals. The Y-decoding circuit 22 supplies the internal control signals to the Y-control circuit 4 that controls column selection timing and the Y-test circuit 1. The data-system decoding circuit 23 decodes the control signals supplied from the outside. The decoded control signals serve as internal control signals. The data-system decoding circuit 23 supplies the internal control signals to the main amplifier 8 that amplifies input/output data signals. The data-system decoding circuit 23 supplies the internal control signals to the data input/output circuit 9 that controls the input/output timings of the data signals.

The X-control circuit 3 controls the X-selection circuit 5 that selects rows of the memory cell array 7, on the basis of the internal signals that have been supplied from the X-decoding circuit 21. The Y-control circuit 4 supplies a signal YIOED indicating column selection timing and a column address signal YA<k:0> to the Y-selection circuit/sense amplifier 6, on the basis of the internal signals have been supplied from the Y-decoding circuit 22 or the Y-test circuit 1.

When the signal YIOED is in the H level, the Y-selection circuit/sense amplifier 6 generates a column selection signal YS that activates the sense amplifiers selected by the column address signal YA<k:0>. The column selection signal YS activates the sense amplifiers, which are connected to the columns of the memory cell array 7. The activation is made using the column selection signal YS. The column selection signal YS supplies data of the selected column to the main amplifier 8.

The memory cell array 7 may include, but is not limited to, memory elements that are provided at intersections of word lines and bit lines. The word lines run in a row direction (X-direction). The bit lines run in a column direction (Y-direction). Data input and output are made to a memory element that is selected by the X-selection circuit 5, the Y-selection circuit/sense amplifier 6.

In the read operation, the main amplifier 8 amplifies the data signals that have been supplied from the Y-selection circuit/sense amplifier 6. The main amplifier 8 supplies the amplified signals the amplified signals to the data input/output circuit 9. In the write operation, the main amplifier 8 supplies the Y-selection circuit/sense amplifier 6 with the data signals which have been supplied from the data input/output circuit 9.

In the read operation, the data input/output circuit 9 outputs, to the outside, the data signals that have been from the main amplifier 8. The data input/output circuit 9 outputs a strobe signal DQS indicating that a data signal DQ is valid. In the write operation, the data input/output circuit 9 receives inputs of the data signal DQ and inputs of the strobe signal DQS indicating that the data signal DQ is valid. The data input/output circuit 9 supplies the input data signals to the main amplifier 8.

Figure 2:
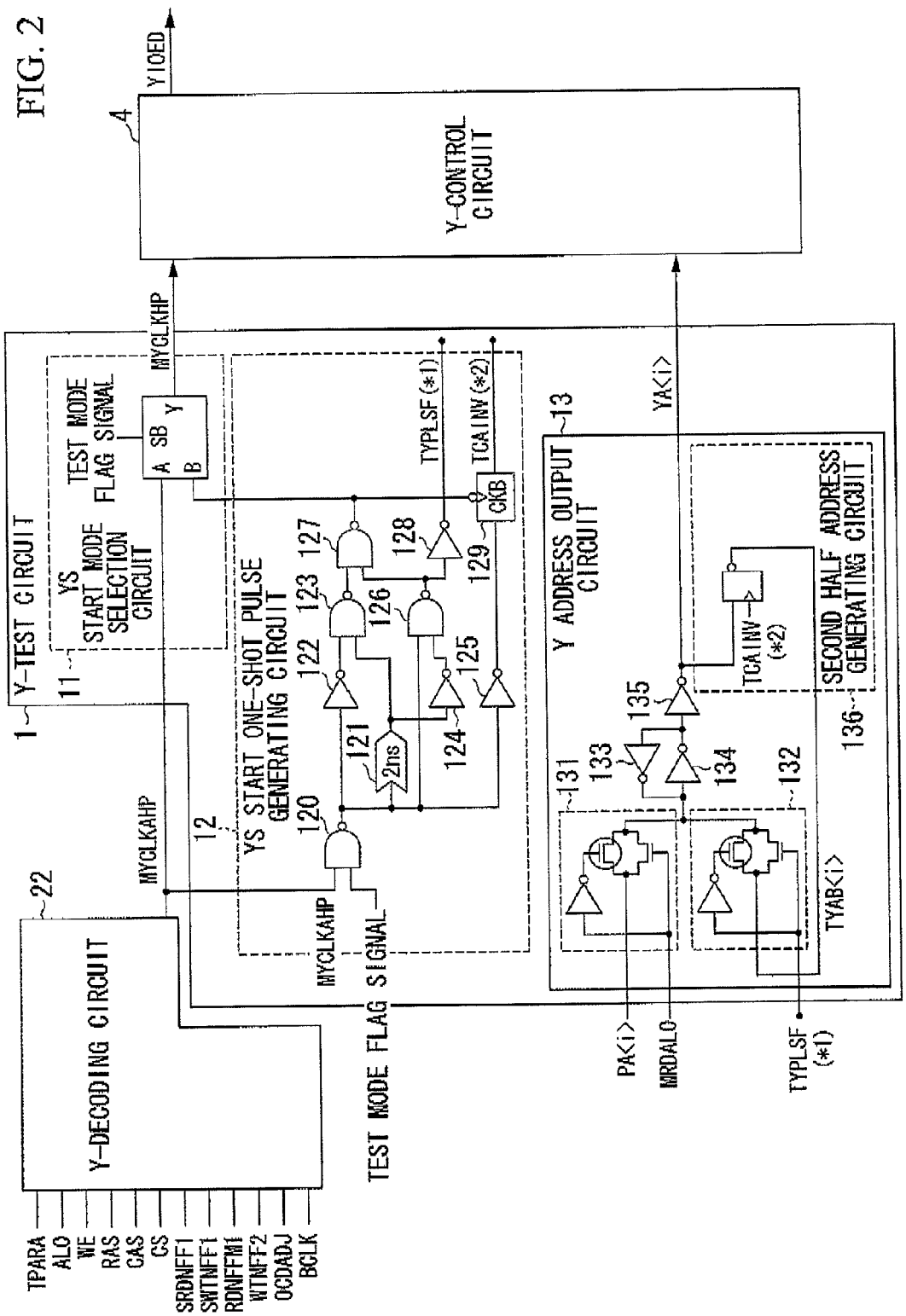
FIG. 2 is a schematic block diagram illustrating the configuration of a test circuit shown in FIG. 1.

FIG. 2 is a schematic block diagram illustrating the configuration of the Y-test circuit 1. The Y-test circuit 1 receives, from the command decoding circuit 2, an internal address signal PA<i> (i=0, ..., k), a signal MRDAL0 indicating that a read command is input, and a test mode flag signal (test mode signal). The Y-test circuit 1 also receives, from the Y-decoding circuit 22, a timing signal MYCLKAHP indicating the output timings of the column selection signal. Then, on the basis of the input signals, the Y-test circuit 1 supplies a signal MYCLKHP indicating column selection timing and a column address signal YA<i> (i=0, ..., k) to the Y-control circuit 4. The test mode flag signal indicates that the parallel test will be performed. The test mode flag signal is set by external commands supplied from the outside. The test mode flag signal is an internal signal supplied by the command decoding circuit 2.

The Y-decoding circuit 22 decodes external control signals and internal control signals and then generates a timing signal MYCLKAHP. The external control signals include the write enable signal WE, the row address strobe signal RAS, the column address strobe signal CAS, and the chip selection signal CS. The internal control signals include a parallel test signal TPARA, a signal AL0, a signal SRDNFF1, a signal SWTNFF1, a signal RDNFFM1, a signal WTNFF2, and a signal OCDADJ. The Y-decoding circuit 22 outputs the timing signal MYCLKAHP synchronized with an internal inverted clock signal BCLK. The signal AL0 indicates that additive latency is '0'. The parallel test signal TPARA is an internal signal that is generated from an external signal indicating test situations. The parallel test signal TPARA indicates that the parallel test is performed. The signal SRDNFF1 indicates read situations. The signal SWTNFF1 indicates write situations. The signal RDNFFM1 is activated in one clock cycle which is half-cycle prior to the column selection clock cycle. This activation is made when values other than '0' are set for the additive latency in the read operation. The signal WTNFF2 is activated in one clock cycle which is half-cycle prior to the column selection clock cycle. This activation is made in the write operation. The signal OCDADJ is activated in the OCD adjustment mode. The internal inverted clock signal BCLK is an inverted signal which is an inversion of the clock signal CK that has been supplied from the outside. The internal inverted clock signal BCLK is transitioned in synchronization with the clock signal CK.

The Y-test circuit 1 may include, but is not limited to, a YS start mode selection circuit 11 (selection circuit), a YS start one-shot pulse generating circuit 12 (one-shot pulse generating circuit), and a Y address output circuit 13. The YS start mode selection circuit 11 receives the timing signal MYCLKAHP. The YS start mode selection circuit 11 also receives a one-shot pulse signal which has been supplied from the YS start one-shot pulse generating circuit 12. When the input test mode flag signal is in the L level, the YS start mode selection circuit 11 supplies the timing signal MYCLKHP as the signal MYCLKHP to the Y-control circuit 4. When the input test mode flag signal is in the H level, the YS start mode selection circuit 11 supplies the one-shot pulse signal as the signal MYCLKHP to the Y-control circuit 4, wherein the one-shot pulse signal has been supplied from the YS start one-shot pulse generating circuit 12.

The YS start one-shot pulse generating circuit 12 receives the timing signal MYCLKAHP. When the test mode flag signal is in the H level, the YS start one-shot pulse generating circuit 12 outputs the one-shot pulse signal with a width of 2 ns at the rising and falling edges of the timing signal MYCLKAHP. At the same time, the YS start one-shot pulse generating circuit 12 further supplies the Y address output circuit 13 with a signal TYPLSF and a signal TCAINV that control the Y address output circuit 13.

The YS start one-shot pulse generating circuit 12 may include, but is not limited to, NAND gates 120, 123, 126, and 127, a delay element 121, inverters 122, 124, 125, and 128, and a flip-flop 129. The NAND gate 120 receives the timing signal MYCLKAHP and the test mode flag signal. The NAND gate 120 performs a NAND operation of the timing signal MYCLKAHP and the test mode flag signal. The NAND gate 120 supplies the NAND-operation result to the inverter 122, the delay element 121, the NAND gate 126, and the inverter 125. The delay element 121 delays, by 2 ns, the signal supplied from the NAND gate 120. The delay element 121 supplies the delayed signal to the NAND gate 123 and the inverter 124. The NAND gate 123 receives the signal inverted by the inverter 122 and the signal delayed by the delay element 121. The NAND gate 123 performs a NAND operation on the received signals. The NAND gate 123 supplies the NAND-operation result to the NAND gate 127.

The NAND gate 126 receives the signal inverted by the inverter 124 and the signal supplied from the NAND gate 120. The NAND gate 126 performs a NAND operation on the received signals. The NAND gate 126 supplies the NAND-operation result to the NAND gate 127 and the inverter 128. The NAND gate 127 receives the signal supplied from the NAND gate 123 and the signal supplied from the NAND gate 126. The NAND gate 127 performs a NAND operation on the received signals. The NAND gate 127 supplies the NAND-operation result as a one-shot pulse signal to the YS start mode selection circuit 11 and the flip-flop 129. The inverter 128 inverts the signal supplied from the NAND gate 126. The inverter 128 supplies the inverted signal as the internal signal TYPLSF to the Y address output circuit 13. When the signal supplied from the NAND gate 127 is in the L level, the flip-flop 129 fetches and holds the signal supplied from the inverter 125. The flip-flop 129 supplies the signal as the internal signal TCAINV to the Y address output circuit 13.

According to the above-described configurations, when the test mode flag signal is in the H level, the YS start one-shot pulse generating circuit 12 supplies a one-shot pulse signal having a width of 2 ns to the YS start mode selection circuit 11 in synchronization with the rising and falling edges of the timing signal MYCLKAHP. The YS start one-shot pulse generating circuit 12 supplies the internal signal TYPLSF and the internal signal TCAINV having a width of 2 ns to the Y address output circuit 13.

When the signal MRDAL0 supplied from the command decoding circuit 2 is in the H level, the Y address output circuit 13 stores the input internal address signal PA<i>. The Y address output circuit 13 supplies the column address signal YA<i> to the Y-control circuit 4. When the signal TCAINV supplied from the YS start one-shot pulse generating circuit 12 is in the H level, the Y address output circuit 13 inverts the stored internal address signal PA<i> to generate a signal TYAB<i> and stores the generated signal. In addition, when the internal control signal TYPLSF supplied from the YS start one-shot pulse generating circuit 12 is in the H level, the Y address output circuit 13 supplies the generated signal TYAB<i> as the column address signal YA<i> to the Y-control circuit 4.

The Y address output circuit 13 may include, but is not limited to, transfer gates 131 and 132, inverters 133 to 135, and a second half address generating circuit 136. The transfer gate 131 receives the signal MRDAL0 and the internal address signal PA<i>. When the signal MRDAL0 is in the H level, the transfer gate 131 supplies the internal address signal PA<i> to the inverter 134. The inverter 134 receives the signals output from the transfer gates 131 and 132. The inverter 134 inverts the received signals. The inverter 134 supplies the inverted signals to the inverters 133 and 135. The inverter 133 inverts the signal supplied from the inverter 134. The inverter 133 supplies the inverted signal to the inverter 134. The inverter 135 inverts the signal supplied from the inverter 134. The inverter 135 supplies the inverted signal as the column address signal YA<i> to the Y-control circuit 4. The inverters 133 and 134 in combination perform as a circuit that holds the signal that will be input to the inverter 135.

The second half address generating circuit 136 may include, but is not limited to, a flip-flop. The second half address generating circuit 136 stores the signal, which has been supplied from the inverter 135, in synchronization with the rising edge of the internal signal TCAINV. The second half address generating circuit 136 supplies the signal TYAB<i>, which is an inversion of the stored signal, to the transfer gate 132. The transfer gate 132 receives the signal TYAB<i> supplied from the second half address generating circuit 136. The transfer gate 132 also receives the internal signal TYPLSF. When the internal signal TYPLSF is in the H level, the transfer gate 132 outputs the signal TYAB<i>.

According to the above-mentioned structure, the Y address output circuit 13 inverts the input internal address signal PA<i> to generate the signal TYAB<i>. When an H-level internal signal TYPLSF is input, the Y address output circuit 13 outputs the generated signal TYAB<i>.

Each of the internal address signal PA<i>, the signal TYAB<i>, and the column address signal YA<i> has a plurality of bits. In addition, the bit width of each of the internal address signal PA<i>, the signal TYAB<i>, and the column address signal YA<i> can be determined based on the configurations of the memory cell array 7. For example, 8-bit signals can be used for 1-Gbit DDR-RAMs.

Figure 3A:
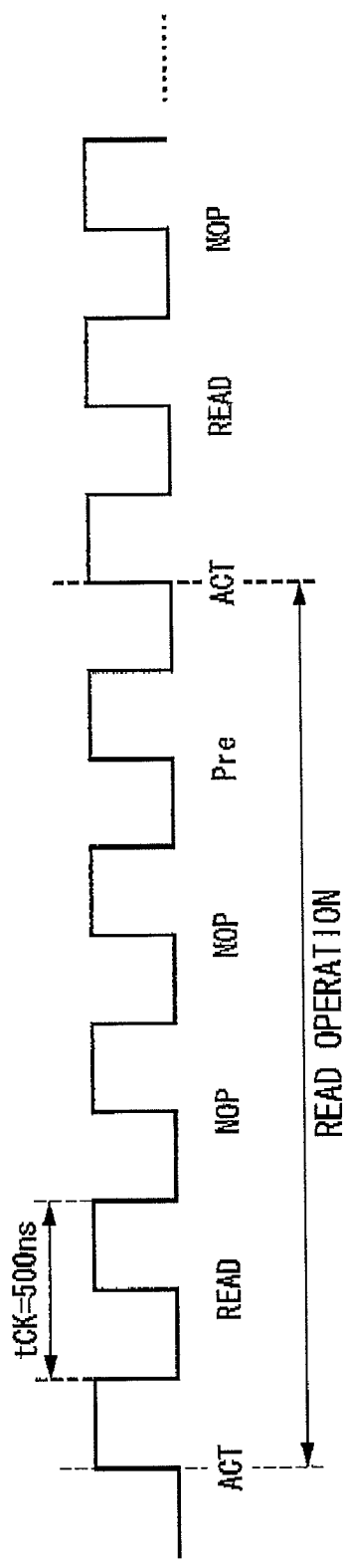
FIG. 3A is a diagram illustrating operation of the semiconductor memory device shown in FIG. 6 in the parallel test.
Figure 3B:
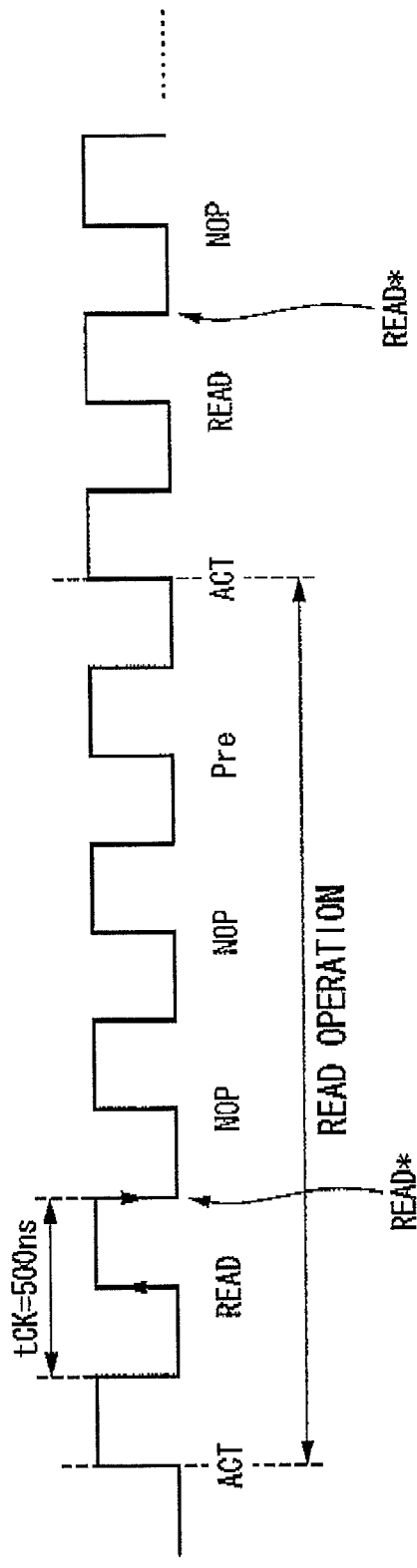
FIG. 3B is a diagram illustrating the operation of the semiconductor memory device of FIG. 1 in the parallel test according to the embodiment of the present invention.

FIGS. 3A and 3B are diagrams illustrating operations of the semiconductor memory devices of FIG. 1 and FIG. 6 in the parallel test.

FIG. 3A is a diagram illustrating operation of the semiconductor memory device shown in FIG. 6 in the parallel test. In the parallel test for the semiconductor memory device, for the read operation, an active command (ACT), a read command (READ), a non-operation command (NOP), a non-operation command (NOP), and a pre-charge command (PRE) are input to the semiconductor memory device in these order to read a single data.

FIG. 3B is a diagram illustrating the operation of the semiconductor memory device of FIG. 1 in the parallel test according to this embodiment. In the parallel test for the semiconductor memory device 100, for the read operation, the active command (ACT), the read command (READ), the non-operation command (NOP), the non-operation command (NOP), and the pre-charge command (PRE) are input to the semiconductor memory device 100 in these order. In the semiconductor memory device 100, the Y-test circuit 1 supplies the signal MYCLKHP and the inverted internal address signal TYAB<i> to the Y-control circuit 4 at the falling edge of the clock signal immediately after the read command has been input. The Y-control circuit 4 supplies the signal YIOED and an inverted signal of the internal address signal to the Y-selection circuit/sense amplifier 6. These operations make it possible to read perform two separate data out of different addresses of the memory by a single read operation.

Figure 4:
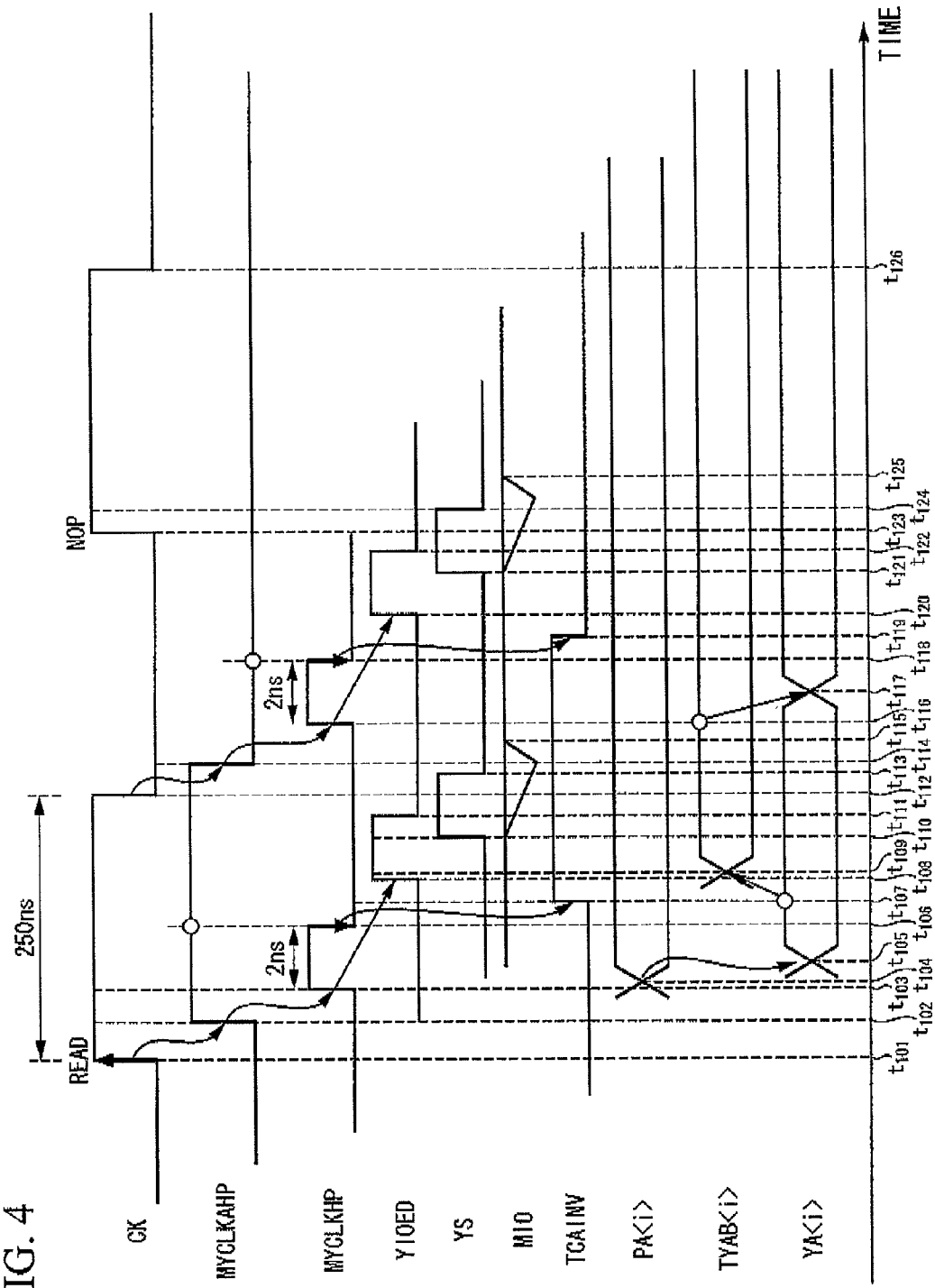
FIG. 4 is a timing chart illustrating the operation of the semiconductor memory device shown in FIG. 1 in the parallel test.

FIG. 4 is a timing chart illustrating the operation of the semiconductor memory device 100 shown in FIG. 1 in the parallel test. In the parallel test, an H-level test mode flag signal is supplied from the command decoding circuit 2 to the Y-test circuit 1.

As shown in FIG. 4, at a time t101, the read command (READ) is input in synchronization with the rising edge of the clock signal CK.

At a time t102, the Y-decoding circuit 22 supplies an H-level timing signal MYCLKAHP to the Y-test circuit 1 when the clock signal CK, is transitioned to the H level.

At a time t103, in the Y-test circuit 1, the YS start mode selection circuit 11 selects the one-shot pulse signal generated by the YS start one-shot pulse generating circuit 12. The YS start mode selection circuit 11 supplies the selected one-shot pulse signal as the signal MYCLKHP to the Y-control circuit 4.

At a time t104, the Y-test circuit 1 receives a valid internal address signal PA<i> and the signal MRDAL0 (not illustrated).

At a time t105, the Y address output circuit 13 supplies the input internal address signal PA<i> as the column address signal YA<i> to the Y-control circuit 4.

At a time t106, the YS start one-shot pulse generating circuit 12 outputs an L-level signal MYCLKHP.

At a time t107, the YS start one-shot pulse generating circuit 12 supplies an H-level internal signal TCAINV to the Y address output circuit 13.

At a time t108, the Y-control circuit 4 supplies an H-level signal YIOED indicating the activation timing of the column selection signal YS to the Y-selection circuit/sense amplifier 6 in response to the input H-level signal MYCLKHP.

At a time t109, the second half address generating circuit 136 stores the internal address signal PA<i>. The second half address generating circuit 136 outputs the signal TYAB<i>, which is an inversion of the internal address signal PA<i>.

At a time t110, the Y-selection circuit/sense amplifier 6 generates the column selection signal YS in response to the input signal YIOED. The Y-selection circuit/sense amplifier 6 activates the sense amplifiers selected by the column address signal YA<i>. The Y-selection circuit/sense amplifier 6 supplies the read data to the main IO (MIO).

At a time t111, the Y-control circuit 4 outputs an L-level signal YIOED when the signal MYCLKHP is transitioned to the L level.

At a time t112, the clock signal CK is transitioned to the L level.

At a time t113, the Y-selection circuit/sense amplifier 6 generates an L-level column selection signal YS when the signal YIOED is transitioned to the L level. The Y-selection circuit/sense amplifier 6 inactivates the internal sense amplifiers.

At a time t114, the Y-decoding circuit 22 generates an L-level timing signal MYCLKAHP when the clock signal CK is transitioned to the L level.

At a time t115, the Y-selection circuit/sense amplifier 6 discontinues the output of valid data from the main IO (MIO) when the internal sense amplifiers are inactivated.

At a time t116, the YS start one-shot pulse generating circuit 12 generates a one-shot pulse signal in synchronization with the falling edge of the timing signal MYCLKAHP. The YS start mode selection circuit 11 selects the generated one-shot pulse signal and supplies the selected one-shot pulse signal as the signal MYCLKHP to the Y-control circuit 4.

At a time t117, the YS start one-shot pulse generating circuit 12 supplies an H-level internal signal TYPLSF to the Y address output circuit 13. The Y address output circuit 13 supplies the signal TYAB<i> as the column address signal YA<i> to the Y-control circuit 4 when the H-level internal signal TYPLSF is input.

At a time t118, the YS start one-shot pulse generating circuit 12 outputs an L-level signal MYCLKHP.

At a time t119, the YS start one-shot pulse generating circuit 12 supplies an L-level internal signal TCAINV to the Y address output circuit 13.

At a time t120, the Y-control circuit 4 outputs an H-level signal YIOED indicating the activation timing of the column selection signal YS to the Y-selection circuit/sense amplifier 6 in response to the input H-level signal MYCLKHP.

At a time t121, the Y-selection circuit/sense amplifier 6 generates the column selection signal YS in response to the input signal YIOED. The Y-selection circuit/sense amplifier 6 activates the sense amplifiers selected by the column address signal YA<i>. The Y-selection circuit/sense amplifier 6 supplies the read data to the main IO (MIO).

At a time t122, the Y-control circuit 4 supplies an L-level signal YIOED when the signal MYCLKHP is transitioned to the L level.

At a time t123, the clock signal CK is transitioned to the H level and the non-operation command (NOP) is input.

At a time t124, the Y-selection circuit/sense amplifier 6 generates an L-level column selection signal YS when the L-level signal YIOED is input, and inactivates the internal sense amplifiers.

At a time t125, the Y-selection circuit/sense amplifier 6 stops the output of valid data from the main IO (MIO) when the internal sense amplifiers are inactivated.

At a time t126, the clock signal CK is transitioned to the L level.

As described above, for the semiconductor memory device 100 being subject to the parallel test, when a read command is input in synchronization with the rising edge of the timing signal MYCLKAHP, the Y-test circuit 1 (test circuit) supplies the Y-control circuit 4 with the one-shot pulse signal that has been generated by the YS start one-shot pulse generating circuit 12 (one-shot pulse generating circuit). The one-shot pulse signal serves as the signal MYCLKHP indicating column selection timing. The Y address output circuit 13 supplies the input internal address signal PA<i> (a plurality of address signals) as the column address signal YA<i> to the Y-control circuit 4. The Y-control circuit 4 controls the Y-selection circuit/sense amplifier 6 to supply data corresponding to the column address signal YA<i> to the main amplifier 8.

In addition, in synchronization with the falling edge of the timing signal MYCLKAHP, the Y-test circuit 1 (test circuit) supplies the one-shot pulse signal to the Y-control circuit 4. The one-shot pulse signal serves as the signal MYCLKHP indicating the column selection timings. The one-shot pulse signal has been generated by the YS start one-shot pulse generating circuit 12 (one-shot pulse generating circuit). The Y address output circuit 13 supplies the Y-control circuit 4 with the signal TYAB<i>, which is an inverted signal of the input internal address signal PA<i> (a plurality of address signals). The Y-control circuit 4 with the signal TYAB<i> serves as the column address signal YA<i>. The Y-control circuit 4 controls the Y-selection circuit/sense amplifier 6 to supply data corresponding to the column address signal YA<i> to the main amplifier 8.

The above configurations and operations of the semiconductor memory device 100 make it possible to output two data corresponding to different column address signals YAB<i> at both the rising and falling edges of the timing signal MYCLKAHP, wherein the timing signal MYCLKAHP has been generated by one read command. As a result, the semiconductor memory device 100 including the Y-system test circuit can read data out of the memory cells in a shorter period of time, for example, a half of the numbers of clock cycles that are necessary for the semiconductor memory device in the related art. The above configurations and operations make it possible to reduce the time required for the parallel test to the semiconductor memory device 100.

According to this embodiment, the tester does not need to change the control signals or the address signals in order to supply the signals to the semiconductor memory device 100. In addition, the above configurations and operations of the semiconductor memory device 100 make it possible to test the semiconductor memory device 100 without changing or modifying the configuration of the tester. The above configurations and operations of the semiconductor memory device 100 can reduce the test time.

The read command has been described with reference to FIG. 4. When a write command is input, the Y-test circuit 1 may perform the same operation as when the read command is input to reduce the test time in the write operation.

In addition, in this embodiment, the second half address generating circuit 136 inverts all the internal address signals PA<i> to generate the signals TYAB<i>. The second half address generating circuit 136 may invert at least one bit of the internal address signals PA<i> to generate address signals different from the input internal address signals PA<i>.

The semiconductor memory device 100 may include, but is not limited to, the test circuit (Y-test circuit 1). The test circuit receives the timing signal (timing signal MYCLKAHP) generated by decoding an access command to a memory region. The test circuit also receives a plurality of address signals (the internal address signals PA<i>) that select data corresponding to the memory region. The test circuit generates a one-shot pulse signal indicating the column selection timing from the input timing signal and the signal obtained by delaying the timing signal, when the level of the timing signal is transitioned. The test circuit outputs the one-shot pulse signal and the plurality of address signals at the rising edge of the timing signal. The test circuit also outputs the one-shot pulse signal and the signal (signal TYAB<i>) at the falling edge of the timing signal, wherein the signal (signal TYAB<i>) has been obtained by inverting at least one of the plurality of address signals.

Figure 5:
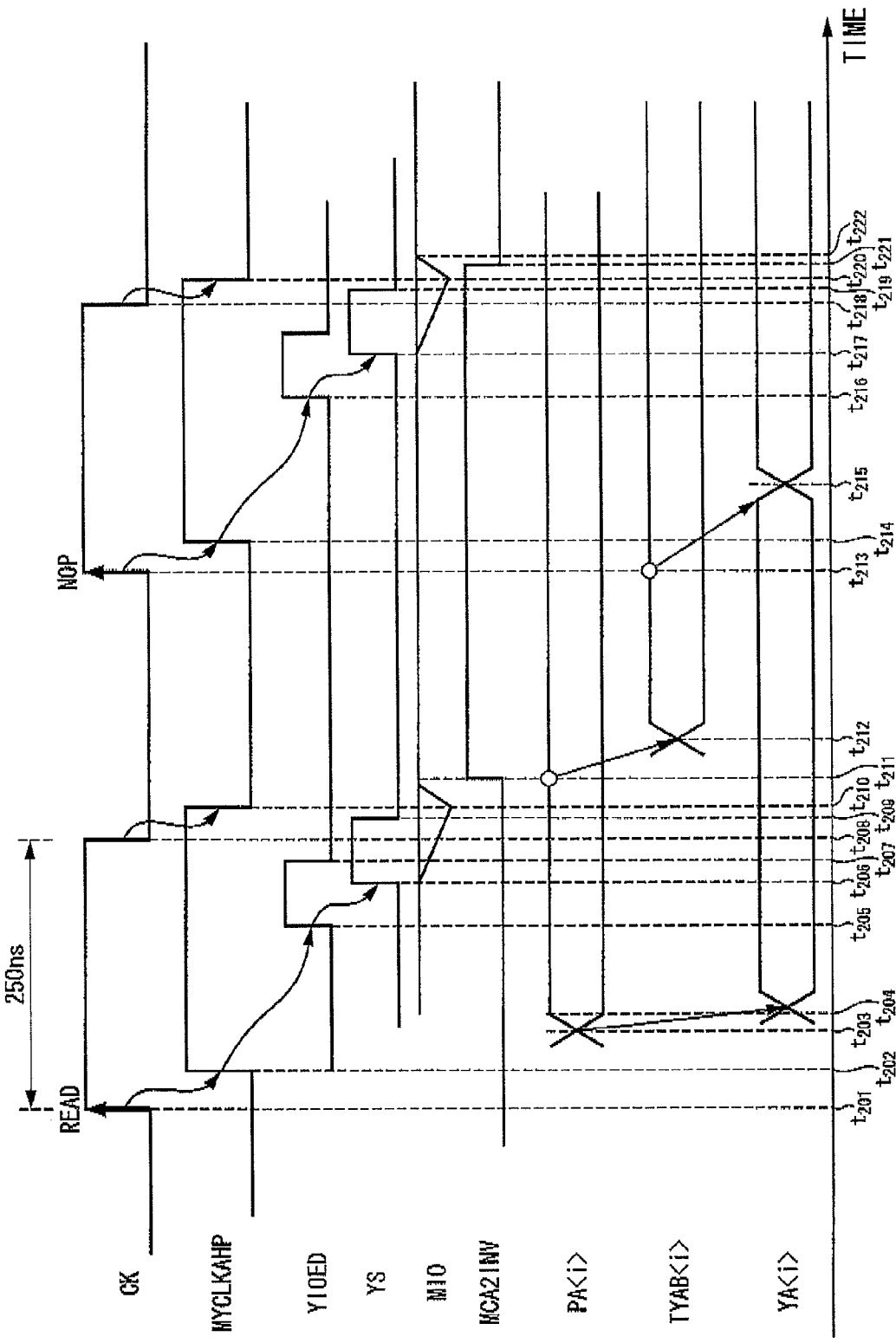
FIG. 5 is a timing chart illustrating operations of the semiconductor memory device of FIG. 1 in a general column burst mode.

FIG. 5 is a timing chart illustrating operations of the semiconductor memory device 100 of FIG. 1 in a general column burst mode. In the general column burst mode, an L-level test mode flag signal is supplied from the command decoding circuit 2 to the Y-test circuit 1.

As shown in FIG. 5, at a time t201, the read command (READ) is input in synchronization with the rising edge of the clock signal CK.

At a time t202, an H-level timing signal MYCLKAHP is supplied from the Y-decoding circuit 22 to the Y-test circuit 1. The YS start mode selection circuit 11 supplies the input signal MYCLKAHP as the signal MYCLKHP to the Y-control circuit 4.

At a time t203, a valid internal address signal PA<i> and the signal MRDAL0 (not shown) are input to the Y-test circuit 1.

At a time t204, the Y address output circuit 13 supplies the input internal address signal PA<i> as the column address signal YA<i> to the Y-control circuit 4.

At a time t205, the Y-control circuit 4 supplies an H-level signal YIOED indicating the activation timing of the column selection signal YS to the Y-selection circuit/sense amplifier 6 in response to the input H-level signal MYCLKHP.

At a time t206, the Y-selection circuit/sense amplifier 6 generates an H-level column selection signal YS in response to the input H-level signal YIOED. The Y-selection circuit/sense amplifier 6 activates the sense amplifiers selected by the column address signal YA<i>. The Y-selection circuit/sense amplifier 6 supplies the read data to the main IO (MIO).

At a time t207, the Y-control circuit 4 outputs an L-level signal. YIOED to the Y-selection circuit/sense amplifier 6.

At a time t208, the clock signal CK is transitioned to the L level.

At a time t209, the Y-selection circuit/sense amplifier 6 generates an L-level column selection signal YS when the L-level signal YIOED is input. The Y-selection circuit/sense amplifier 6 inactivates the internal sense amplifiers.

At a time t210, the Y-decoding circuit 22 supplies an L-level timing signal MYCLKAHP to the Y-test circuit 1 when the clock signal CK is transitioned to the L level.

At a time t211, the Y-selection circuit/sense amplifier 6 stops the output of valid data from the main IO (MIO) when the internal sense amplifiers axe inactivated. The command decoding circuit 2 outputs an H-level internal signal MCA2INV.

At a time t212, the command decoding circuit 2 inverts the internal address signal PA<i> to generate the signal YAB<i>, using the output internal signal MCA2INV.

At a time t213, the non-operation command (NOP) is input to the semiconductor memory device 100 in synchronization with the rising edge of the clock signal CK.

At a time t214, the Y-decoding circuit 22 supplies an H-level timing signal MYCLKAHP to the Y-test circuit 1 when the clock signal CK is transitioned to the H level. In the Y-test circuit 1, the YS start mode selection circuit 11 supplies the input timing signal MYCLKAHP as the signal MYCLKHP to the Y-control circuit 4.

At a time t215, the command decoding circuit 2 supplies the inverted signal YAB<i> as the column address signal YA<i> to the Y-control circuit 4.

At a time t216, the Y-control circuit 4 supplies an H-level signal YIOED to the Y-selection circuit/sense amplifier 6 in response to the input H-level signal MYCLKHP.

At a time t217, the Y-selection circuit/sense amplifier 6 generates an H-level column selection signal YS in response to the input H-level signal YIOED. The Y-selection circuit/sense amplifier 6 activates the sense amplifiers selected by the column address signal YA<i>. The Y-selection circuit/sense amplifier 6 supplies the read data to the main IO (MIO).

At a time t218, the clock signal CK is transitioned to the L level.

At a time t219, the Y-selection circuit/sense amplifier 6 generates the L level column selection signal YS when the L-level signal YIOED is input. The Y-selection circuit/sense amplifier 6 inactivates the internal sense amplifiers.

At a time t220, the Y-decoding circuit 22 supplies the L level timing signal MYCLKAHP to the Y-test circuit 1 when the clock signal CK is transitioned to the L level.

At a time t221, the command decoding circuit 2 outputs the L level internal signal MCA2INV.

At a time t222, the Y-selection circuit/sense amplifier 6 discontinues the output of valid data from the main IO (MIO) when the internal sense amplifiers are inactivated.

As described above, the semiconductor memory device 100 inactivates the Y-test circuit 1 using the test mode flag signal in the read operation in a general burst column mode. Therefore, the semiconductor memory device 100 can be operated without any problem.

It is apparent that the present invention is not limited to the above embodiments, but may be modified and changed without departing from the scope and spirit of the invention.

What is claimed is:

1. A semiconductor device comprising: a test circuit that generates a pulse signal from a timing signal,
   the test circuit that outputs the pulse signal and a first set of address signals in response to a first type transition of the timing signal, and
   the test circuit that outputs the pulse signal and a second set of address signals in response to a second type transition of the timing signal, the second set of address signals being different from the first set of address signals,
   wherein the test circuit receives the timing signal and the first set of address signals from outside the test circuit, and the timing signal is generated in accordance with a single command.

2. The semiconductor device according to claim 1, wherein the test circuit allows the semiconductor device to perform read operations, in a parallel test mode, to read out data at the first set of address signals in response to the first type transition of the timing signal, and other data at the second set of address signals in response to the second type transition of the timing signal, the timing signal has been generated in accordance with the single command.

3. The semiconductor device according to claim 1, wherein the single command is a single read command.

4. The semiconductor device according to claim 1, wherein the test circuit allows the semiconductor device to perform write operations, in a parallel test mode, to write data at the first set of address signals in response to the first type transition of the timing signal, and other data at the second set of address signals in response to the second type transition of the timing signal, the timing signal has been generated in accordance with the single command.

5. The semiconductor device according to claim 1, wherein the single command is a single write command.

6. The semiconductor device according to claim 1, wherein the test circuit inverts at least one address signal of the first set of address signals to generate the second set of address signals.

7. The semiconductor device according to claim 1, wherein the test circuit that generates the pulse signal in response to the first type and second type transitions of the timing signal.

8. The semiconductor device according to claim 1, further comprising:
   a memory cell array; and
   a command decoding circuit coupled to the test circuit, the command decoding circuit decoding an access command to a memory area of the memory cell array to generate the timing signal, the command decoding circuit supplying the timing signal to the test circuit.

9. The semiconductor device according to claim 8, wherein the first set of address signals selects data corresponding to the memory area.

10. The semiconductor device according to claim 8, wherein the pulse signal indicates timings of selection to the memory cell.

11. The semiconductor device according to claim 10, further comprising:
   a memory cell array; and a sense amplifier circuit connected to the selected column of the memory cell array, wherein the address signal selects a column of the memory cell array for input and output of data from the selected column, and the pulse signal activates the sense amplifier circuit.

12. The semiconductor device according to claim 1, wherein the test circuit generates the pulse signal from the timing signal and a delay signal which is delayed from the timing signal.

13. The semiconductor device according to claim 1, wherein the test circuit comprises:

a selecting circuit that receives the timing signal, the pulse signal, and a test mode signal that indicates that a parallel test is performed, and the selecting circuit selects one of the timing signal and the pulse signal based on the test mode signal.

14. The semiconductor device according to claim 1, wherein the test circuit is inactivated based a level of a test mode signal to allow the semiconductor device to perform at least one of read and write operations in a burst mode.

15. A semiconductor device comprising:

a test circuit that receives a timing signal and a first set of address signals, the timing signal being generated in accordance with a single command, the test circuit that generates a pulse signal from the timing signal, the test circuit that outputs the pulse signal and the first set of address signals in response to a first type transition of the timing signal, the test circuit that outputs the pulse signal and a second set of address signals in response to a second type transition of the timing signal, the second set of address signals being different from the first set of address signals, a memory cell array, and a command decoding circuit coupled to the test circuit, the command decoding circuit decoding an access command to a memory area of the memory cell array to generate the timing signal, the command decoding circuit supplying the timing signal to the test circuit.

16. A semiconductor device comprising:

a test circuit that receives a timing signal and a plurality of address signals, the timing signal being generated by decoding an access command to a memory area, the plurality of address signals selecting data corresponding to the memory area, the test circuit that generates a one-shot pulse signal from the timing signal and a delay signal in response to a transition of the timing signal, the one-shot pulse signal indicating timings of column selection, the delay signal being delayed from the timing signal, the test circuit that outputs the one-shot pulse signal and the plurality of address signals as a column address signal at a first type transition of the timing signal, and the test circuit that outputs the one-shot pulse signal and a set of address signals as the column address signal at a second type transition of the timing signal, the set of address signals being obtained by inverting at least one address signal of the plurality of address signals.

17. The semiconductor device according to claim 16, wherein the test circuit comprises:

a selecting circuit that receives the timing signal, the one-shot pulse signal, and a test mode signal that indicates that a parallel test is performed, and the selecting circuit selects one of the timing signal and the one-shot pulse signal based on the test mode signal.

18. The semiconductor device according to claim 17, further comprising:

a memory cell array; and a sense amplifier circuit connected to the selected column of the memory cell array, wherein the column address signal selects a column of the memory cell array for input and output of data from the selected column, and the one-shot pulse signal activates the sense amplifier circuit.

* * * * *